United States Patent
Sasaki et al.

(10) Patent No.: US 11,881,396 B2
(45) Date of Patent: Jan. 23, 2024

(54) DEPOSITION METHOD

(71) Applicant: Tokyo Electron Limited, Tokyo (JP)

(72) Inventors: Koji Sasaki, Yamanashi (JP); Keisuke Suzuki, Yamanashi (JP); Tomoya Hasegawa, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 214 days.

(21) Appl. No.: 17/184,807

(22) Filed: Feb. 25, 2021

(65) Prior Publication Data

US 2021/0280411 A1  Sep. 9, 2021

(30) Foreign Application Priority Data

Mar. 6, 2020  (JP) ................. 2020-038628

(51) Int. Cl.
*H01L 21/02* (2006.01)
*C23C 16/40* (2006.01)

(52) U.S. Cl.
CPC ...... *H01L 21/02164* (2013.01); *C23C 16/401* (2013.01); *H01L 21/02216* (2013.01)

(58) Field of Classification Search
CPC ......... H01L 21/02216; H01L 21/02164; C23C 16/401; C23C 16/402
See application file for complete search history.

(56) References Cited

U.S. PATENT DOCUMENTS

| | | | |
|---|---|---|---|
| 2008/0050884 A1* | 2/2008 | Koyanagi | H01L 21/3142 438/785 |
| 2009/0209081 A1* | 8/2009 | Matero | C23C 16/401 257/E21.546 |
| 2012/0036732 A1* | 2/2012 | Varadarajan | H01L 21/02164 34/276 |
| 2015/0004317 A1* | 1/2015 | Dussarrat | C23C 16/30 427/255.6 |
| 2017/0207082 A1* | 7/2017 | Wang | C23C 16/401 |
| 2018/0223047 A1* | 8/2018 | Xiao | C23C 16/401 |
| 2019/0233446 A1* | 8/2019 | MacDonald | C07F 7/21 |
| 2020/0248309 A1* | 8/2020 | Wang | C23C 16/401 |
| 2021/0017198 A1* | 1/2021 | MacDonald | C23C 16/45553 |
| 2022/0333241 A1* | 10/2022 | Wang | C23C 16/401 |

FOREIGN PATENT DOCUMENTS

JP  2018-154615  10/2018

* cited by examiner

*Primary Examiner* — Jay C Chang
*Assistant Examiner* — Siangluai Mang
(74) *Attorney, Agent, or Firm* — IPUSA, PLLC

(57) ABSTRACT

A deposition method of forming silicon oxide films collectively on a plurality of substrates in a processing container performs a plurality of execution cycles each of which includes: supplying a silicon material gas containing an organoamino-functionalized oligosiloxane compound into the processing container; and supplying an oxidizing gas into the processing container adjusted to a pressure of 1 Torr to 10 Torr (133 Pa to 1333 Pa).

2 Claims, 5 Drawing Sheets

DEPOSITION METHOD

CROSS-REFERENCE TO RELATED APPLICATIONS

This patent application is based upon and claims priority to Japanese Patent Application No. 2020-038628 filed on Mar. 6, 2020, the entire contents of which are incorporated herein by reference.

TECHNICAL FIELD

The present disclosure relates to a deposition method.

BACKGROUND

A technique using a composition containing an organoamino-functionalized oligosiloxane compound as a precursor for deposition of a silicon-containing film is known (see, for example, Patent Document 1).

RELATED ART DOCUMENT

Patent Document

[Patent Document 1] Japanese Laid-open Patent Application Publication No. 2018-154615

SUMMARY

The present disclosure provides a technique that enables to form silicon oxide films with good uniformity with high productivity.

According to one aspect of the present disclosure, a deposition method of forming silicon oxide films collectively on a plurality of substrates in a processing container performs a plurality of execution cycles each of which includes: supplying a silicon material gas containing an organoamino-functionalized oligosiloxane compound into the processing container; and supplying an oxidizing gas into the processing container adjusted to a pressure of 1 Torr to 10 Torr (133 Pa to 1333 Pa).

According to the present disclosure, it is possible to form silicon oxide films with good uniformity with high productivity.

DETAILED DESCRIPTION OF EMBODIMENTS

Figure 1:
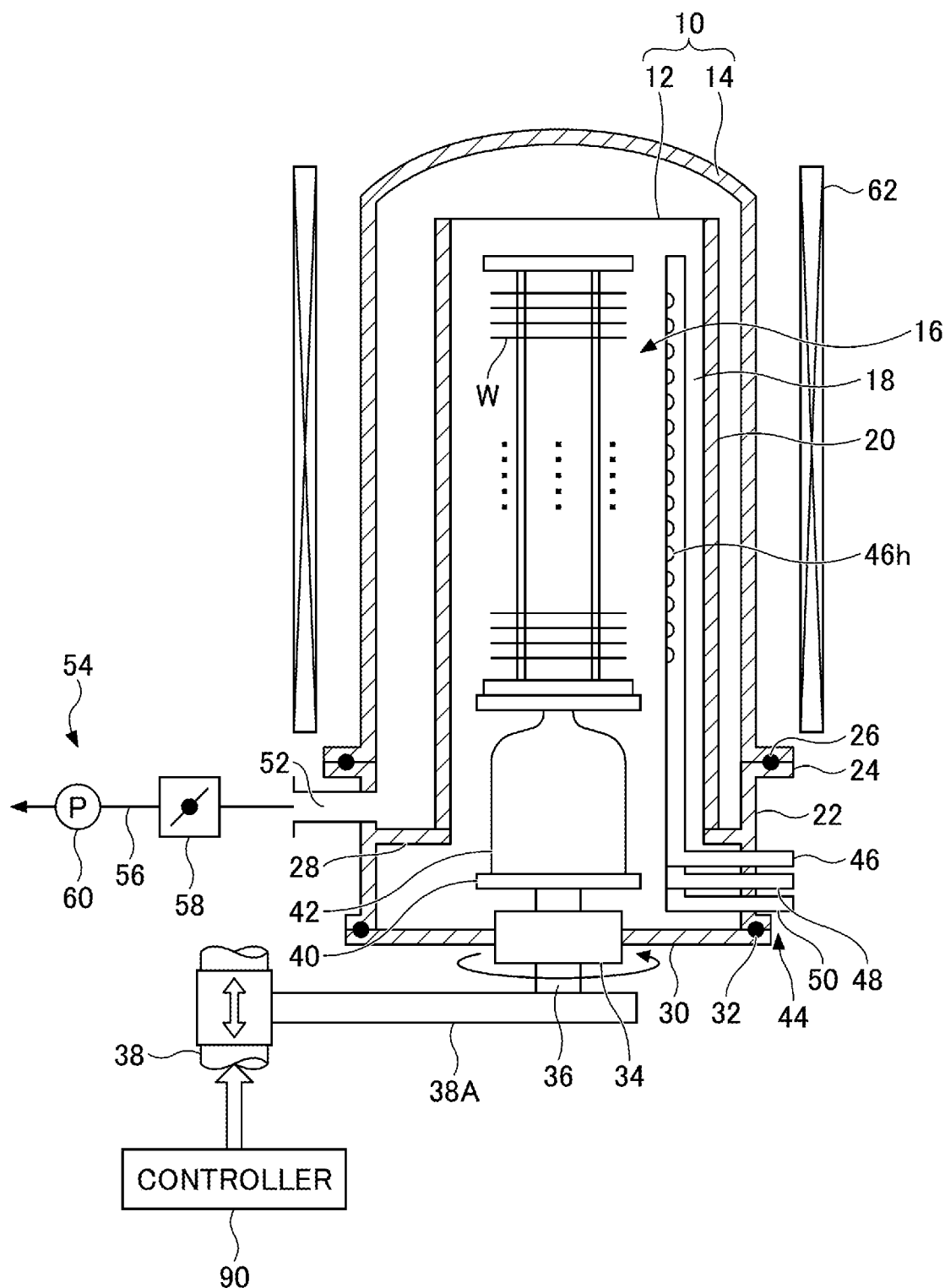
FIG. 1 is a longitudinal cross-sectional view illustrating a configuration example of a vertical heat processing apparatus.

Hereinafter, non-limiting exemplary embodiments of the present disclosure will be described with reference to the accompanying drawings. In all the accompanying drawings, the same or corresponding reference numerals shall be attached to the same or corresponding components and overlapping descriptions may be omitted.

(Deposition Apparatus)

Figure 2:
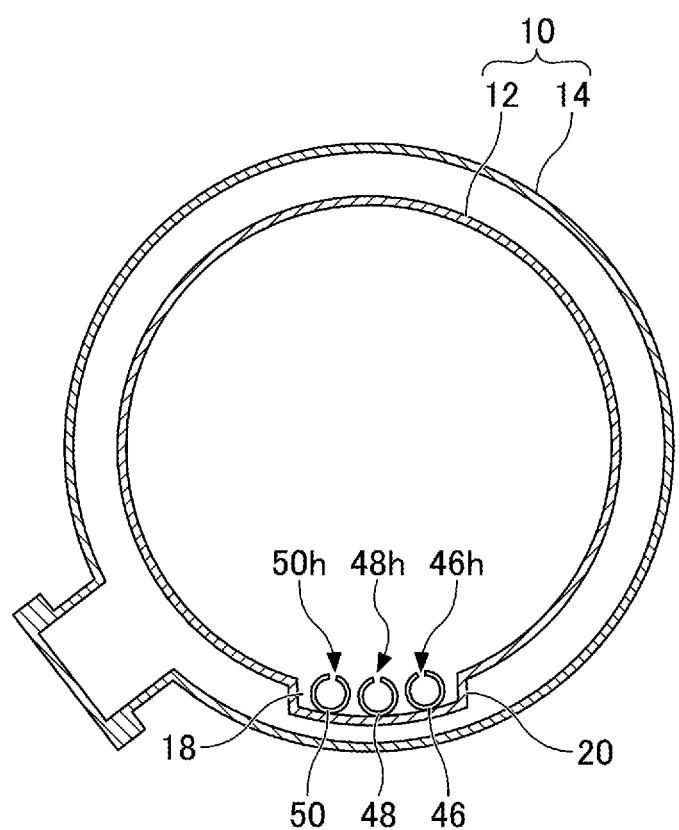
FIG. 2 is a diagram that depicts a processing container of the vertical heat processing apparatus of FIG. 1.

Referring to FIG. 1 and FIG. 2, an example of a deposition apparatus according to an embodiment will be described. In the following, a batch-type vertical heat processing apparatus that collectively processes a large number of substrates will be described as an example of a deposition apparatus. FIG. 1 is a longitudinal cross-sectional view illustrating a configuration example of a vertical heat processing apparatus. FIG. 2 is a diagram that depicts a processing container of the vertical heat processing apparatus of FIG. 1.

The vertical heat processing apparatus 1 has a vertically long shape extending in the vertical direction as a whole. The vertical heat processing apparatus 1 includes a processing container 10 that extends in the vertical direction.

The processing container 10 has a dual tube structure of a cylindrically shaped inner tube 12 and an outer tube 14 that is concentrically placed outside the inner tube 12 and having a ceiling. The inner tube 12 and the outer tube 14 are formed of a heat-resistant material, such as quartz or silicon carbide. The processing container 10 is configured to accommodate a wafer boat 16 that is a substrate holder for holding a large number (for example, 25 to 200) of semiconductor wafers (hereinafter referred to as "wafers W") in a shelf manner at intervals in the vertical direction.

A nozzle housing 18 is formed on one side of the inner tube 12 to accommodate gas nozzles along the longitudinal direction (vertical direction) of the inner tube 12. For example, as illustrated in FIG. 2, a portion of the side wall of the inner tube 12 protrudes outward to form a protrusion 20, and the inside of the protrusion 20 is formed as the nozzle housing 18.

The lower end of the processing container 10 is supported by a cylindrical manifold 22 formed of, for example, stainless steel. A flange 24 is formed on the upper end of the manifold 22. The lower end of the outer tube 14 is placed on the flange 24, and is supported by the flange 24. A sealing member 26, such as an O-ring, is interposed between the flange 24 and the lower end of the outer tube 14 to keep the interior of the outer tube 14 airtight.

An annular support 28 is provided on the inner wall of the upper portion of the manifold 22. The lower end of the inner tube 12 is placed on the support 28, and is supported by the support 28. To the opening of the manifold 22, which is provided at the lower end of the manifold 22, a lid 30 is hermetically attached via a sealing member 32, such as an O-ring, to airtightly seal the opening of the processing container 10 at its lower end, i.e., the opening of the manifold 22. The lid 30 is formed of, for example, stainless steel.

A rotating shaft 36 is provided to pass through the center of the lid 30 in a plan view, via a ferrofluidic seal 34. The lower portion of the rotating shaft 36 is rotatably supported on an arm 38A of a lifting/lowering section 38 including a boat elevator.

A rotary plate 40 is provided on the upper end of the rotating shaft 36. On the rotary plate 40, the wafer boat 16 for holding the wafers W is placed via a heat insulating tube 42 made of quartz. Accordingly, by lifting/lowering the lifting/lowering section 38, the lid 30 and the wafer boat 16 are moved up and down together and the wafer boat 16 can be inserted into and removed from the processing container 10.

On the side wall of the lower portion of the manifold 22 and below the support 28, a gas supply section 44 is provided for introducing various gases into the interior of the inner tube 12.

The gas supply section 44 includes multiple (e.g., three) gas nozzles 46, 48, and 50, which are made of quartz. The gas nozzles 46, 48, and 40 are provided within the inner tube 12 along its longitudinal direction. A base end portion of each of the gas nozzles 46, 48, and 40 is bent in an L-shape, and is supported so as to penetrate the manifold 22.

To the gas nozzle 46, a supply source of silicon material gas is connected via a pipeline, and the silicon material gas is introduced with a controlled flow rate. For example, the silicon material gas includes an organoamino-functionalized oligosiloxane compound such as 2-dimethylamino-2,4,6,8-tetramethyl cyclotetrasiloxane (trade name LTO890) as indicated by the following structural formula A.

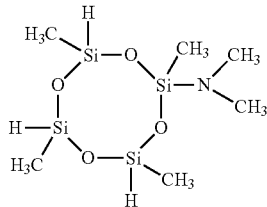

To the gas nozzle 48, a supply source of an oxidizing gas is connected via a pipeline and the oxidizing gas is introduced with a controlled flow rate. The oxidizing gas is, for example, an oxygen ($O_2$) gas or an ozone ($O_3$) gas.

To the gas nozzle 50, a supply source of a purge gas is connected via a pipeline and the purge gas is introduced with a controlled flow rate. The purge gas is, for example, an argon (Ar) gas or a nitrogen ($N_2$) gas.

Within the nozzle housing 18 of the inner tube 12, the gas nozzles 46, 48, and 50 are arrayed along a circumferential direction of the inner tube 12, as illustrated in FIG. 2. On the respective gas nozzles 46, 48, and 50, a plurality of gas holes 46*h*, 48*h*, 50*h* are formed at predetermined intervals along the longitudinal direction of the gas nozzles 46, 48, and 50. The respective gas holes 46*h*, 48*h*, and 50*h* discharge respective gasses in the horizontal direction. As a result, the respective gasses are supplied from the surroundings of the wafers W substantially parallel to the main surfaces of the wafers W. The predetermined intervals are set, for example, to be the same as the intervals between the wafers W supported by the wafer boat 16. Also, a position in the height direction of each of the gas holes 46*h*, 48*h*, and 50*h* is set to be located at a middle position between wafers W adjacent in the vertical direction, so that the gases can be efficiently supplied to spaces between the wafers W.

Above the support 28, a gas outlet 52 is formed on the side wall of the upper portion of the manifold 22, to exhaust gas in the inner tube 12 through a space between the inner tube 12 and the outer tube 14. An exhaust section 54 is provided at the gas outlet 52. The exhaust section 54 includes an exhaust passage 56 connected to the gas outlet 52. A pressure regulating valve 58 and a vacuum pump 60 are sequentially interposed in the exhaust passage 56 to be able to evacuate the processing container 10.

A cylindrical-shaped heater 62 is provided on the outer peripheral side of the outer tube 14 so as to cover the outer tube 14. The heater 62 heats the wafers W housed within the processing container 10.

The vertical heat processing apparatus 1 is provided with a controller 90 composed of, for example, a computer. The controller 90 includes a data processor including a program, a memory, and a CPU. In the program, instructions (each step) is Included so that a control signal is transmitted from the controller 90 to each section of the vertical heat processing apparatus 1 to execute a deposition method, which will be described later below. The program is stored in a storage medium, such as a flash memory, a hard disk, or an optical disk, to be installed in the controller 90.

Here, when a silicon material gas and an oxidizing gas are alternately supplied to form silicon oxide films, bonds such as Si—H bonds and Si—$CH_3$ bonds contained in the silicon material adsorbed on the surfaces of the wafers W are cleaved by the action of the oxidizing gas and Si—OH bonds are generated. Then, when the silicon material gas is supplied again, the hydroxyl groups (OH groups) of the Si—OH bonds are replaced by the silicon material, and the silicon oxide films are deposited. That is, the more the number of bonds such as Si—H bonds and Si—$CH_3$ bonds, the more silicon oxide films are deposited per cycle.

For example, 2-dimethylamino-2,4,6,8-tetramethylcyclotetrasiloxane, which is an example of an organoamino-functionalized oligosiloxane compound, contains three Si—H bonds and four Si—$CH_3$ bonds, as indicated by the structural formula A described above.

On the other hand, diisopropylaminosilane (DIPAS), which is a silicon raw material that is not an organoamino-functionalized oligosiloxane compound, has three Si—H bonds, as indicated by the following structural formula B.

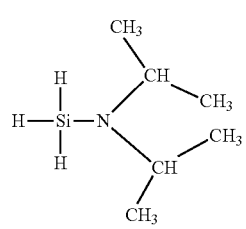

Therefore, it is considered that using an organoamino-functionalized oligosiloxane compound such as 2-dimethylamino-2,4,6,8-tetramethyl cyclotetrasiloxane as a silicon material gas enhances the deposition rate with respect to using DIPAS.

However, when the number of bonds such as Si—H bonds and Si—$CH_3$ bonds is large, it takes a lot of oxidizing gas to cleavage the Si—H bonds and the Si—$CH_3$ bonds and terminate with the OH groups and the time required for oxidation increases. In other words, it is difficult to form silicon oxide films with high productivity.

In particular, in the vertical heat processing apparatus 1, because a process is performed while accommodating a large number of wafers W in the processing container 10, in comparison to a single-wafer deposition apparatus, the number of Si—H bonds and Si$CH_3$ bonds to be terminated with OH groups by an oxidizing agent is increased in proportion to the number of wafers W. As a result, a particularly large amount of oxidizing gas is required, and the time required for oxidation is prolonged. In other words, it is particularly difficult to form silicon oxide films with high productivity.

Accordingly, as a result of diligent investigation, the inventors of the present invention have found that silicon oxides film with good uniformity can be formed with high productivity by adjusting the pressure in the processing container 10 in a predetermined pressure range when an oxidizing gas is supplied. In the following, a deposition method by which silicon oxide films having good uniformity can be formed with high productivity will be described.

<Deposition Method>

Figure 3:
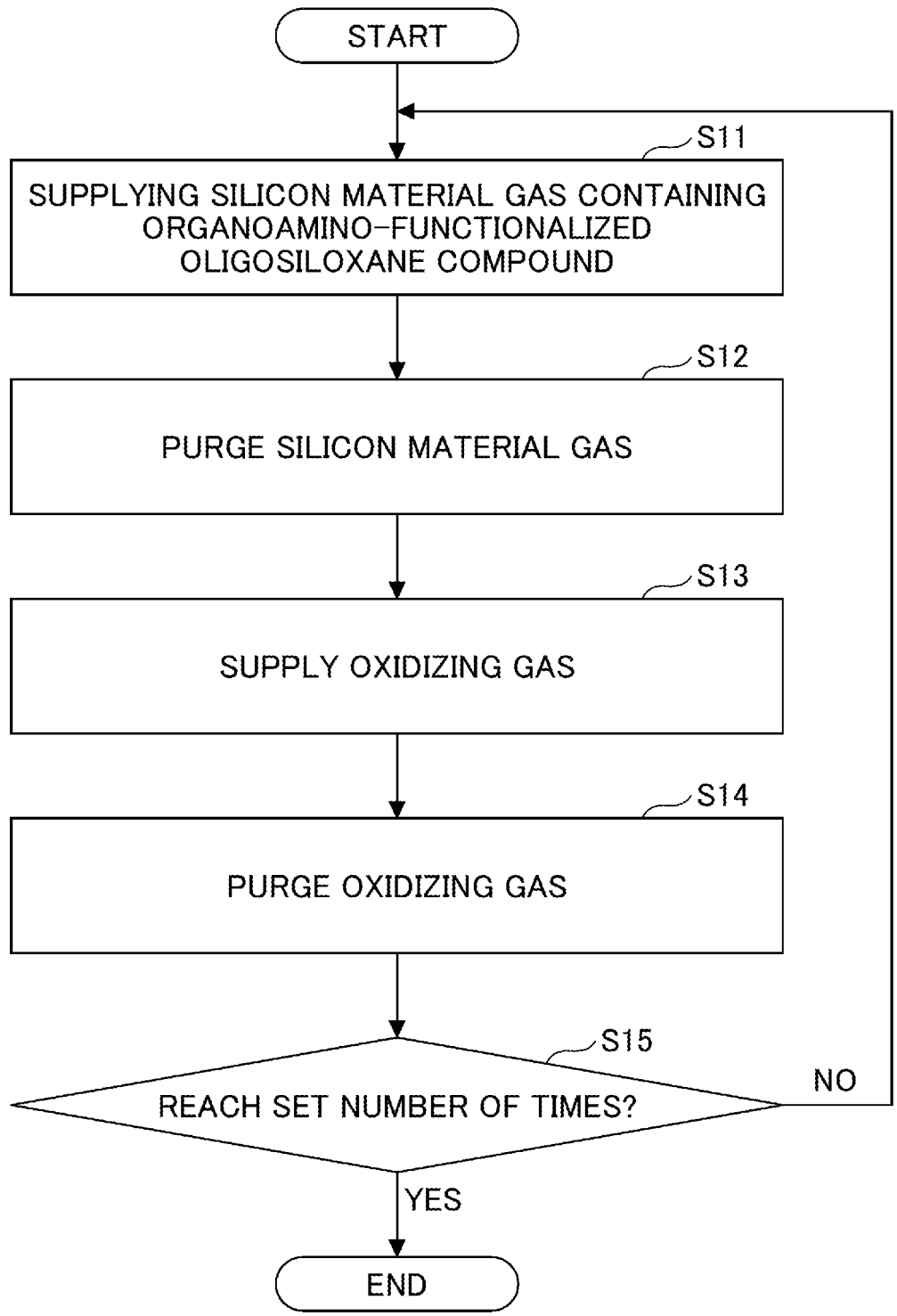
FIG. 3 is a flowchart illustrating an example of a deposition method according to an embodiment.

With reference to FIG. 3, an example of a deposition method of silicon oxide films that is executed by the vertical heat processing apparatus 1 will be described. FIG. 3 is a flowchart illustrating an example of a deposition method according to an embodiment.

First, the controller 90 controls the lifting/lowering section 38 and transports the wafer boat 16 holding a large number of wafers W into the processing container 10. The controller 90 also airtightly closes and seals the opening at the lower end of the processing container 10 by the lid 30.

Subsequently, the controller 90 controls the exhaust section 54 to adjust the interior of the processing container 10 to a set pressure, and controls the heater 62 to adjust the wafers W to a set temperature. The controller 90 also rotates the wafer boat 16.

Subsequently, the controller 90 supplies a silicon material gas containing an organoamino-functionalized oligosiloxane compound from the gas nozzle 46 into the processing container 10 (step S11). Thereby, silicon is adsorbed on the wafers W. The set pressure of step S11 is, for example, 1 Torr to 2 Torr (133 Pa to 267 Pa).

Subsequently, while supplying a purge gas such as Ar gas or $N_2$ gas from the gas nozzle 50 into the processing container 10, the controller 90 controls the exhaust section 54 to evacuate the interior of the processing container 10 (step S12). Thereby, the silicon material gas remaining in the processing container 10 is purged. It should be noted that the controller 90 may perform supplying the purge gas and evacuating the interior of the processing container 10 alternately.

Subsequently, the controller 90 supplies an oxidizing gas from the gas nozzle 48 into the processing container 10 adjusted to a predetermined pressure (step S13). Thereby, the silicon adsorbed on the wafers W is oxidized. More specifically, the Si—H bonds and the Si—$CH_3$ bonds contained in the silicon material adsorbed on the surfaces of the wafers W are cleaved by the action of the oxidizing gas and the Si—OH bonds are generated. In this case, it is preferable that the predetermined pressure is greater than or equal to 1 Torr (133 Pa) from the viewpoint of obtaining good within-wafer uniformity. Further, it is more preferable that the predetermined pressure is greater than or equal to 1.5 Torr (200 Pa) from the viewpoint of obtaining good wafer-to-wafer uniformity in addition to good within-wafer uniformity. In addition, it is preferable that the predetermined pressure is 10 Torr (1333 Pa) or less from the viewpoint that the oxidizing gas can be purged in a short time in step S14, which will be described later below.

Subsequently, while supplying a purge gas such as Ar gas or $N_2$ gas from the gas nozzle 50 into the processing container 10, the controller 90 controls the exhaust section 54 to evacuate the interior of the processing container 10 (step S14). Thereby, the oxidizing gas remaining in the processing container 10 is purged. It should be noted that the controller 90 may perform supplying the purge gas and evacuating the interior of the processing container 10 alternately.

Subsequently, the controller 90 determines whether or not the number of repetitions of step S11 to step S14 has reached a set number of times (step S15). The set number of times is predetermined in accordance with the film thickness of silicon oxide films to be formed. When the number of repetitions has not reached the set number of times, the controller 90 returns the process to step S11. On the other hand, when the number of repetitions has reached the set number of times, the controller 90 terminates the process. Thereby, the silicon oxide films having a desired thickness are formed on the wafers W.

EXAMPLES

As Examples, using the vertical heat processing apparatus 1, including the upper portion, the central portion, and the lower portion of the wafer boat 16, a large number of wafers W were mounted and silicon oxide films were formed on the surfaces of the wafers W by the deposition method described above.

In Examples, the time in step S13 (hereinafter, referred to as "oxidation time") was fixed to 10 seconds, and the set pressure in step S13 (hereinafter, referred to as "oxidation pressure") was changed to perform the deposition process multiple times. The oxidation pressures were 0.5 Torr (67 Pa), 1.0 Torr (133 Pa), 1.5 Torr (200 Pa), 2.8 Torr (373 Pa) and 3.9 Torr (520 Pa). Also, in Examples, 2-dimethylamino-2,4,6,8-tetramethylcyclotetrasiloxane was used as an organoamino-functionalized oligosiloxane compound, and a mixture gas of $O_2$ gas and $O_3$ gas was used as an oxidizing gas.

Subsequently, for each wafer W mounted on the upper portion, the central portion, and the lower portion of the wafer boat 16, the film thickness at multiple locations in the surface (within the wafer) was measured. Then, based on the film thickness measured at the multiple locations, the uniformity of the film thickness in the surface for each wafer W (hereinafter, referred to as "within-wafer uniformity") and the uniformity of the film thickness between the surfaces (hereinafter, referred to as "wafer-to-wafer uniformity") were calculated.

Figure 4:
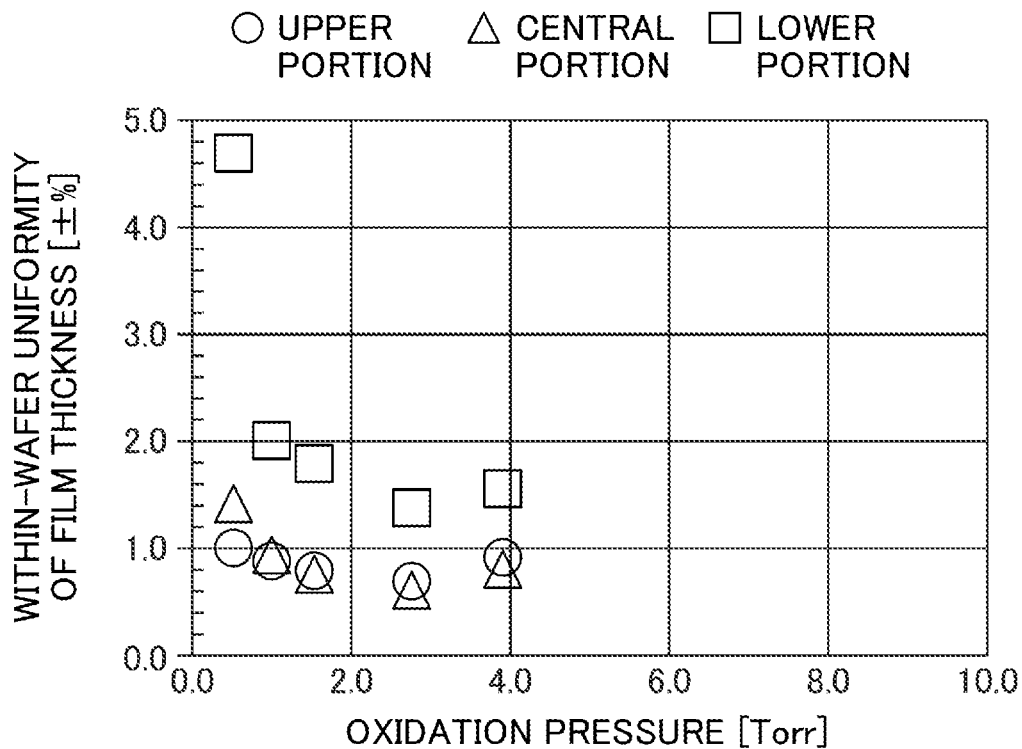
FIG. 4 is a diagram illustrating within-wafer uniformity of a film thickness when an oxidation pressure is changed.

FIG. 4 is a diagram illustrating the within-wafer uniformity of the film thickness when the oxidation pressure is changed. In FIG. 4, the vertical axis indicates the within-wafer uniformity of the film thickness [±%] and the horizontal axis indicates the oxidation pressure [Torr]. Also, the symbols "○", "Δ" and "□" indicate the measurement results of the wafers W mounted on the upper portion, the central portion, and the lower portion of the wafer boat 16, respectively.

As illustrated in FIG. 4, it was confirmed that, in a case in which the oxidation pressure is 1 Torr or more, the within-wafer uniformity of the film thickness of the wafers W mounted on the upper portion, the central portion, and the lower portion of the wafer boat 16 is ±2% or less, indicating that the within-wafer uniformity is good. On the other hand, it was confirmed that, in a case in which the oxidation pressure is 0.5 Torr, the within-wafer uniformity of the film thickness of the wafers W mounted on the lower portion of the wafer boat 16 is ±4.7%, indicating that the within-wafer uniformity significantly deteriorates. Therefore, it is considered that by setting the oxidation pressure to 1 Torr or more, silicon oxide films with good within-wafer uniformity can be formed with a short oxidation time (10 seconds).

Figure 5:
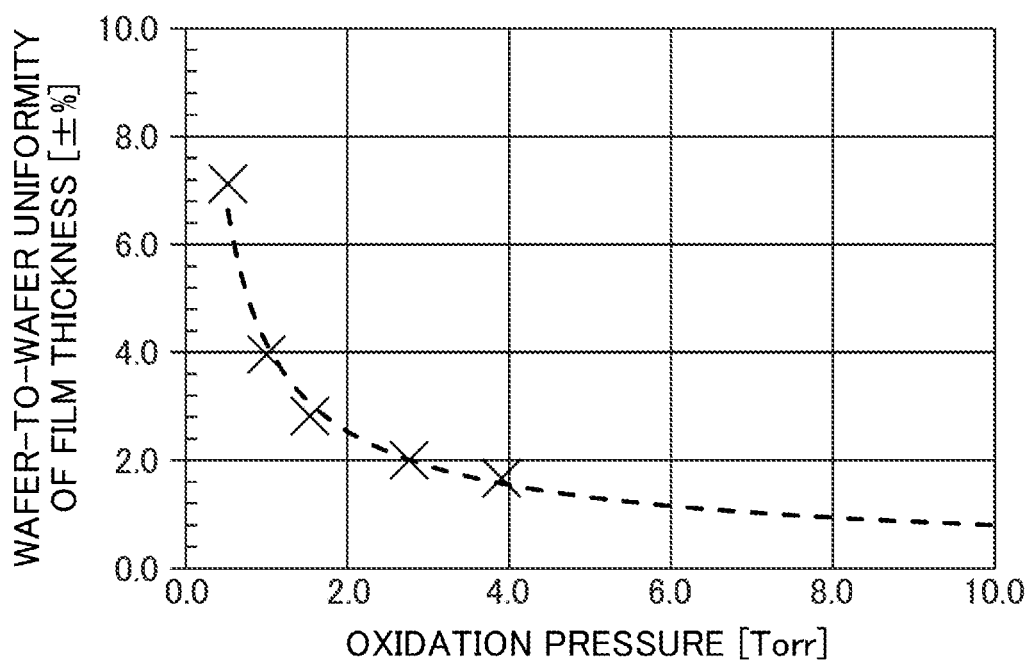
FIG. 5 is a diagram illustrating wafer-to-wafer uniformity of a film thickness when an oxidation pressure is changed.

FIG. 5 is a diagram illustrating the wafer-to-wafer uniformity of the film thickness when the oxidation pressure is changed. In FIG. 5, the vertical axis indicates the wafer-to-wafer uniformity of the film thickness [±%] and the horizontal axis indicates the oxidation pressure [Torr].

As illustrated in FIG. 5, it was confirmed that as the oxidation pressure is increased, the wafer-to-wafer uniformity of the film thickness is enhanced. In particular, in a case in which the oxidation pressure is 1.5 Torr or more, the wafer-to-wafer uniformity of the film thickness is ±3° or less, indicating that the wafer-to-wafer uniformity is good. Therefore, it is considered that by setting the oxidation pressure to 1.5 Torr or more, silicon oxides film with good wafer-to-wafer uniformity can be formed in a short oxidation time (10 seconds).

Reference Examples

As Reference Examples, using the vertical heat processing apparatus 1, including the upper portion, the central portion, and the lower portion of the wafer boat 16, a large number of wafers W were mounted and silicon oxide films were formed on the surfaces of the wafers W by the deposition method described above.

In Reference Examples, the oxidation pressure was fixed at 0.5 Torr (67 Pa), and the oxidation time was changed to perform the deposition process multiple times. The oxidation times were 10 seconds, 19 seconds, and 60 seconds. Also, in Reference Examples, 2-dimethylamino-2,4,6,8-tetramethylcyclotetrasiloxane was used as an organoamino-functionalized oligosiloxane compound, and a mixture gas of $O_2$ gas and $O_3$ gas) was used as an oxidizing gas.

Subsequently, for each wafer W mounted on the upper portion, the central portion, and the lower portion of the wafer boat 16, the film thickness at multiple locations in the surface (within the wafer) was measured. Then, based on the film thickness measured at the multiple locations, the within-wafer uniformity and the wafer-to-wafer uniformity of the film thickness were calculated.

Figure 6:
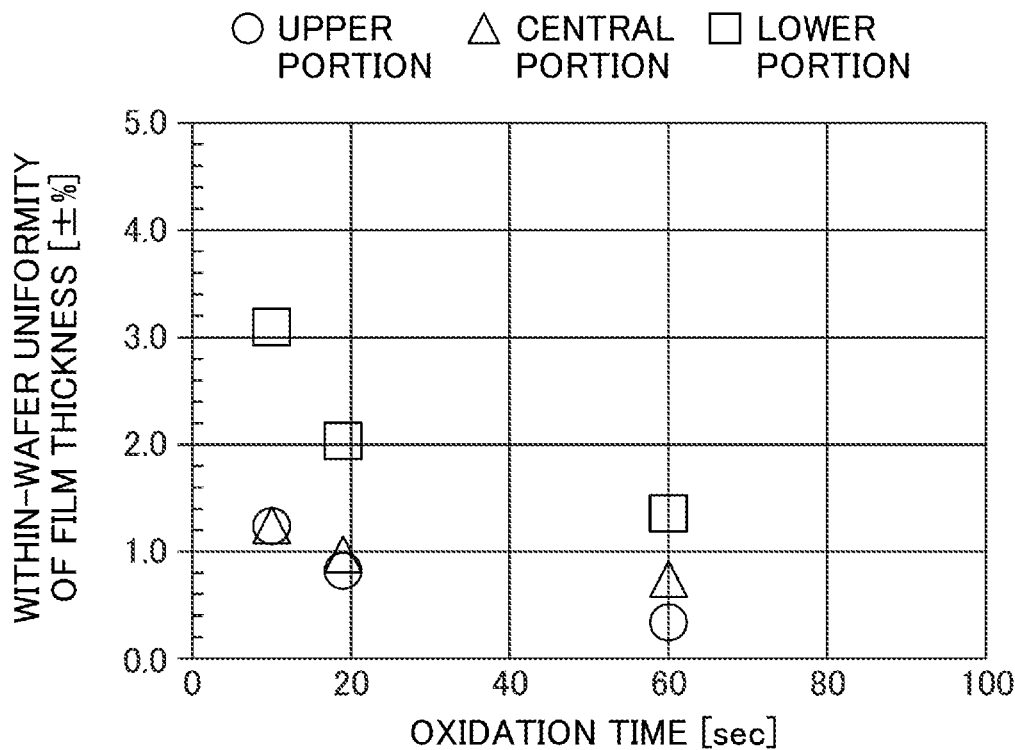
FIG. 6 is a diagram illustrating within-wafer uniformity of a film thickness when an oxidation time is changed.

FIG. 6 is a diagram illustrating the within-wafer uniformity of the film thickness when the oxidation time is changed. In FIG. 6, the vertical axis indicates the within-wafer uniformity of the film thickness [±%] and the horizontal axis indicates the oxidation time [sec]. Also, the symbols "○", "Δ" and "□" indicate the measurement results of the wafers W mounted on the upper portion, the central portion, and the lower portion of the wafer boat 16, respectively.

As indicated in FIG. 6, it was confirmed that by increasing the oxidation time, the within-wafer uniformity of the film thickness of the wafers W mounted on the upper portion, the central portion and the lower portion of the wafer boat 16 is enhanced. Therefore, it is considered that silicon oxide films with good within-wafer uniformity can be formed by increasing the oxidation time. However, when the oxidation time is increased, the time required for the film deposition process is increased, and the productivity is decreased. That is, it is difficult to achieve both high productivity and good within-wafer uniformity.

Figure 7:
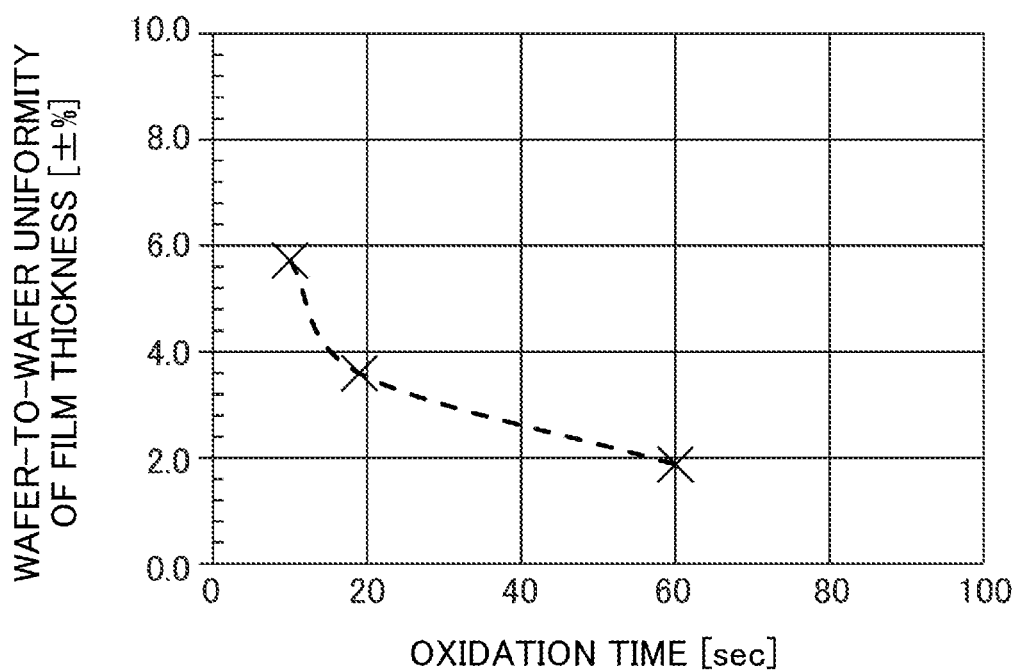
FIG. 7 is a diagram illustrating wafer-to-wafer uniformity of a film thickness when an oxidation time is changed.

FIG. 7 is a diagram illustrating the wafer-to-wafer uniformity of the film thickness when the oxidation time is changed. In FIG. 7, the vertical axis indicates the wafer-to-wafer uniformity of the film thickness [±%] and the horizontal axis indicates the oxidation time [sec].

As illustrated in FIG. 7, it was confirmed that as the oxidation time is increased, the wafer-to-wafer uniformity of the film thickness is enhanced. Therefore, it is considered that silicon oxide films with good wafer-to-wafer uniformity can be formed by increasing the oxidation time. However, when the oxidation time is increased, the time required for the deposition process is increased, and the productivity is decreased. That is, it is difficult to achieve both high productivity and good wafer-to-wafer uniformity.

As described above, according to Examples and Reference Examples, it is considered that by setting the oxidation pressure to 1 Torr or more, silicon oxide films with good within-wafer uniformity can be formed with high productivity. Specifically, as illustrated in FIG. 4 and FIG. 6, by setting the oxidation pressure to 1 Torr, even when the oxidation time is short (10 seconds), within-wafer uniformity equivalent to that when the oxidation time is 20 seconds is obtained. Also, as illustrated in FIG. 4 and FIG. 6, by setting the oxidation pressure to 2.8 Torr, even when the oxidation time is short (10 seconds), within-wafer uniformity equivalent to that when the oxidation time is 60 seconds is obtained.

Also, according to Examples and Reference Examples, it is considered that by setting the oxidation pressure to 1.5 Torr or more, silicon oxide films with good wafer-to-wafer uniformity can be formed with high productivity. Specifically, as illustrated in FIG. 5 and FIG. 7, by setting the oxidation pressure to 1.5 Torr, even when the oxidation time is short (10 seconds), wafer-to-wafer uniformity better than that when the oxidation time is 20 seconds is obtained. Also, as illustrated in FIG. 5 and FIG. 7, by setting the oxidation pressure to 2.8 Torr, even when the oxidation time is short (10 seconds), wafer-to-wafer uniformity equivalent to that when the oxidation time is 60 seconds is obtained. Further, as illustrated in FIG. 5 and FIG. 7, by setting the oxidation pressure to 3.9 Torr, even when the oxidation time is short (10 seconds), wafer-to-wafer uniformity better than that when the oxidation time is 60 seconds is obtained.

As described above, according to the deposition method of the embodiment, a silicon material gas containing an organoamino-functionalized oligosiloxane compound is supplied to the wafers W to cause silicon to adsorb onto the wafers W. Thereby, the deposition rate and the productivity are enhanced relative to the use of a silicon material gas that does not contain such an organoamino-functionalized oligosiloxane compound.

Also, according to the deposition method of the embodiment, by supplying an oxidizing gas into the processing container 10 is adjusted to a pressure of 1 Torr to 10 Torr (133 Pa to 1333 Pa) to oxidize the silicon material gas containing the organoamino-functionalized oligosiloxane compound adsorbed on the surfaces of the wafers W. Thereby, the uniformity of the film thickness of the silicon oxide films is enhanced.

Thus, according to the deposition method of the embodiment, silicon oxide films with good uniformity can be formed with high productivity.

The embodiments disclosed herein should be considered to be exemplary in all respects and not 13 restrictive. The above embodiments may be omitted, substituted, or modified in various forms without departing from the appended claims and spirit thereof.

It should be noted that although the organoamino-functionalized oligosiloxane compound is 2-dimethylamino-2,4,6,8-tetramethyl cyclotetrasiloxane in the embodiment described above, the present disclosure is not limited to this. For example, it may be a cyclic organoamino-functionalized oligosiloxane compound such as 2-dimethylamino-2,4,4,6,6-pentamethylcyclotrisiloxane, 2-diethylamino-2,4,4,6,6-pentamethylcyclotrisiloxane, 2-ethylmethylamino-2,4,4,6,6-pentamethylcyclotrisiloxane, 2-iso-propylamino-2,4,4,6,6-pentamethylcyclotrisiloxane, 2-dimethylamino-2,4,6,6,8,8-heptamethylcyclotetrasilosiloxane, 2-diethylamino-2,4,4,6,6,8,8-heptamethylcyclotetrasiloxane, 2-ethylamino-2,4,4,6,6,8,8-heptamethylcyclotetrasiloxane, 2-iso-propylamino-2,4,6,6,8-heptamethylcyclotetrasiloxane, 2-dimethylamino-2,4,6-trimethylcyclosiloxane, 2-diethylamino-2,4,6-trimethvlcyclosiloxane, 2-ethylmethylamino-2,4,6-trimethylcyclotrisiloxane, 2-iso-propylamino-2,4,6-trimethylcyclotrisiloxane, 2-diethylamino-2,4,6,8-tetramethylcyclotetrasiloxane, 2-ethylmethylamino-2,4,6,8-tetramethylcyclotetrasiloxane, and 2-iso-propylamino-2,4,6,8-tetramethylcyclotetrasiloxane. Also, for example, it may be a linear organoamino-functionalized oligosiloxane compound such as 1-dimethylamino-1,1,3,3,5,5-hexamethyl-5-methoxysiloxane, 1-dimethylamino-1,1,3,3,5,5,7,7-octamethyl-7-methoxytrisiloxane, 1-dimethylamino-1,1,3,3,5,5-hexamethyl-5-acetoxytrisiloxane, 1-dimethylamino-1,1,3,3,5,5,7,7-octamethyl-7-acetoxytrisiloxane, 1-dimethylamino-1,1,3,3,5,5,7,7,9,9-undecamethylpentasiloxane, 1-dimethylamino-1,1,3,3,5,5,5,7,7-octamethyltetrasiloxane, 1-dimethylamino-1,1,3,3,5,5,7,9,9-decamethylpentasiloxane, 1-dimethylamino-1,3,3,5,7,7,7-octamethyltetrasiloxane, 1-dimethylamino-1,3,3,5,5,7,7,7,9,9,9-decamethylpentasiloxane, 1-dimethylamino-3,3,5,5,7,7,7-heptamethyltetrasiloxane, 1-dimethylamino-3,3,5,5,7,7,9,9,9-nonamethylpentasiloxane, 1-dimethylamino-1,3,5,7,7,7-hexamethyltetrasiloxane, and 1-dimethylamino-1,3,5,7,9,9,9-heptamethylpentasiloxane.

What is claimed is:

1. A deposition method of forming silicon oxide films collectively on a plurality of substrates in a processing container, the deposition method performing a plurality of execution cycles each of which includes:

supplying a silicon material gas containing an organoamino-functionalized oligosiloxane compound into the processing container adjusted to a pressure in a first range; and supplying an oxidizing gas into the processing container adjusted to a pressure in a second range different from the first range, the second range being from 1.5 Torr to 10 Torr (200 Pa to 1333 Pa), wherein the organoamino-functionalized oligosiloxane compound is 2-dimethylamino-2,4,6,8-tetramethylcyclotetrasiloxane, and the oxidizing gas is a mixture gas of $O_2$ gas and $O_3$ gas), and wherein a length of oxidation time in the supplying of the oxidizing gas is set such that film thickness uniformity within each of the silicon oxide films is ±2% or less and such that film thickness uniformity between the silicon oxide films is ±3% or less.

2. The deposition method according to claim 1, wherein the processing container is able to accommodate a substrate holder that holds the plurality of substrates with intervals in a vertical direction.

* * * * *